United States Patent [19]

Le Roux

[11] Patent Number: 4,922,202

[45] Date of Patent: May 1, 1990

[54] METHOD FOR MEASURING FLOWS IN A NUCLEAR MAGNETIC RESONANCE EXPERIMENT

[75] Inventor: Patrick Le Roux, Gyf sur Yvette, France

[73] Assignee: General Electric CGR S.A., Issy les Moulineaux, France

[21] Appl. No.: 192,526

[22] Filed: May 11, 1988

[30] Foreign Application Priority Data

May 12, 1987 [FR] France ............................... 87 06650

[51] Int. Cl.$^5$ ........................................... G01R 33/20
[52] U.S. Cl. ..................................... 324/306; 324/300
[58] Field of Search .................. 73/306, 309; 128/653; 324/300

[56] References Cited

U.S. PATENT DOCUMENTS 4,574,240  3/1986  Libove et al. ........................ 324/306
4,602,641  7/1986  Feinberg ............................. 128/653

FOREIGN PATENT DOCUMENTS 0117134  8/1984  European Pat. Off. .
0126381  11/1984  European Pat. Off. .
0234526  9/1987  European Pat. Off. .

OTHER PUBLICATIONS

Mansfield, P. et al., "Planar Spin Imaging by NMR", J. of Mag. Res., vol. 27, pp. 101-119, No. 1, Jul. 1977.
Mansfield, P., "Multi-Planar Image Formation Using NMR Spin Echoes", Journ. of Phys. C, vol. 10, No. 3, pp. L-55-L58 (Feb. '77).
IEEE Transactions on Medical Imaging, vol. MI-5, No. 3, Sep. 1986, pp. 140-151, IEEE, New York, U.S.: D. G. Nishimura et al.; "Magnetic resonance angiography".

Primary Examiner—Michael J. Tokar
Attorney, Agent, or Firm—Oblon, Spivak, McClelland, Maier & Neustadt

[57] ABSTRACT

In a nuclear magnetic resonance experiment, the flows are measured by causing the orientation of the magnetic moments of the particles located in a slice to flip and by subsequently causing the scattering of the phases of the magnetic resonance signals to be reflected only for particles which have migrated into a slice adjacent to the slice in which the flipping has been done. It is shown that the relative dynamic range of the measured NMR signal for the moving parts in relation to the measured signal for the fixed parts becomes infinite.

3 Claims, 5 Drawing Sheets

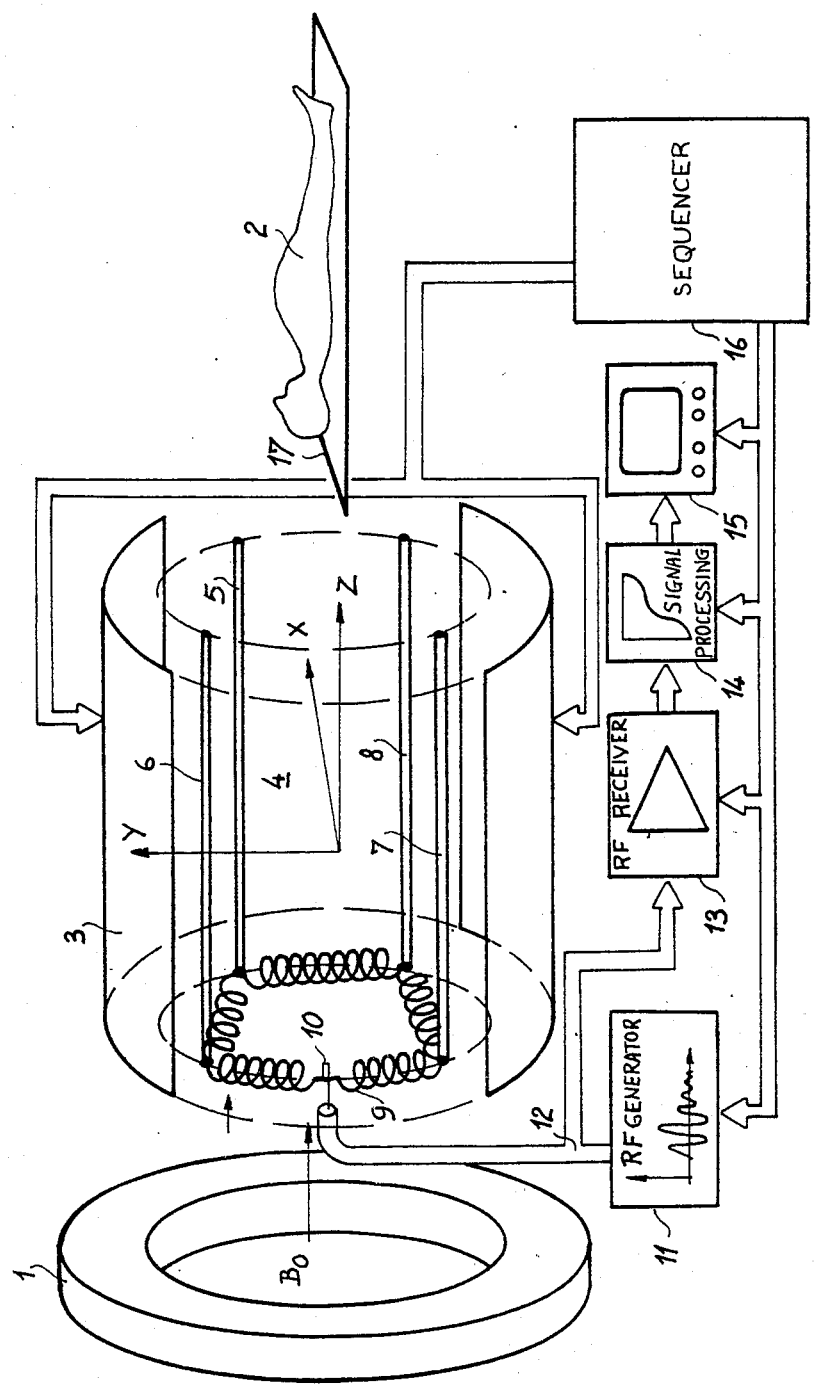
FIG_1

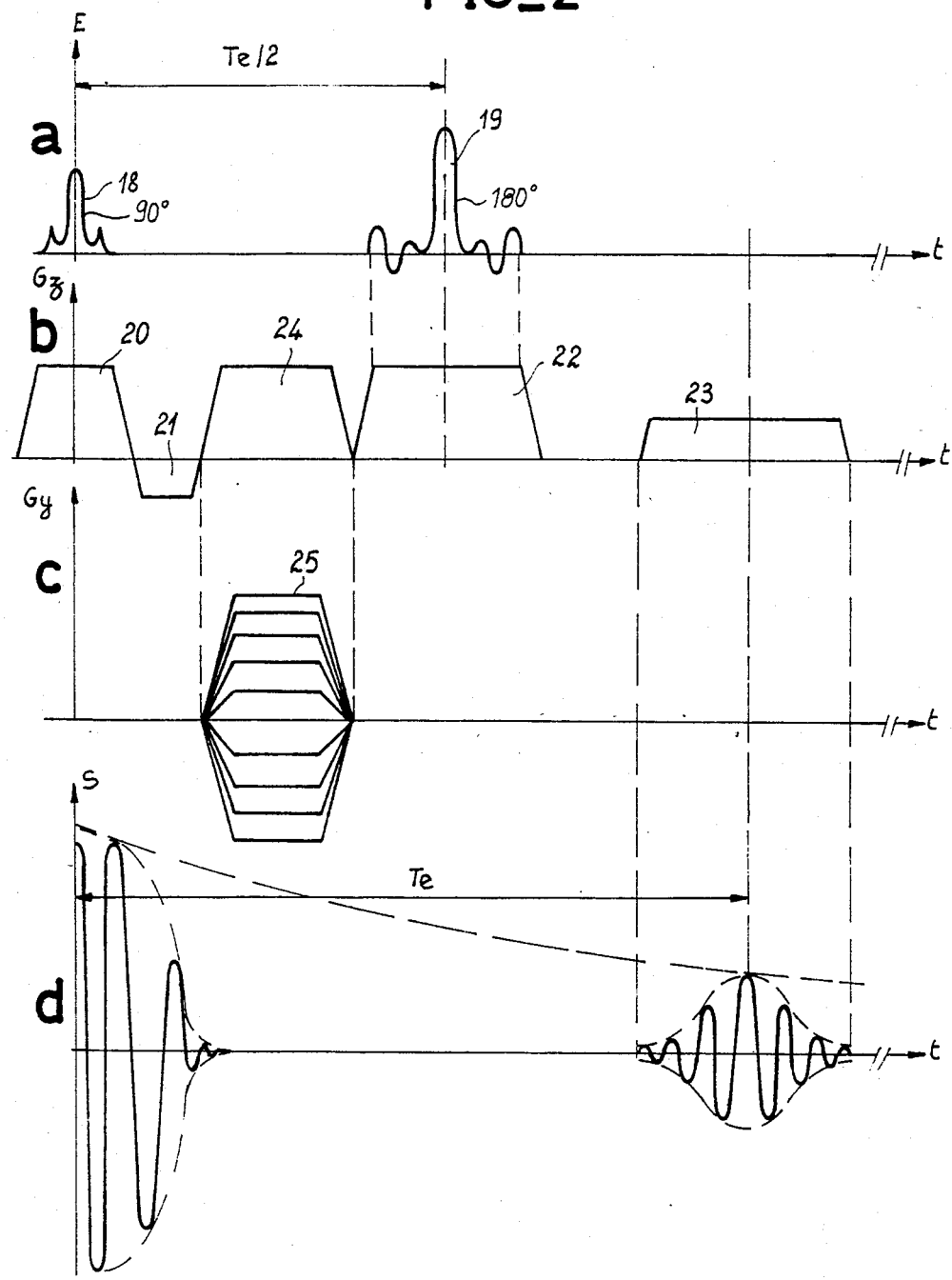
FIG_2

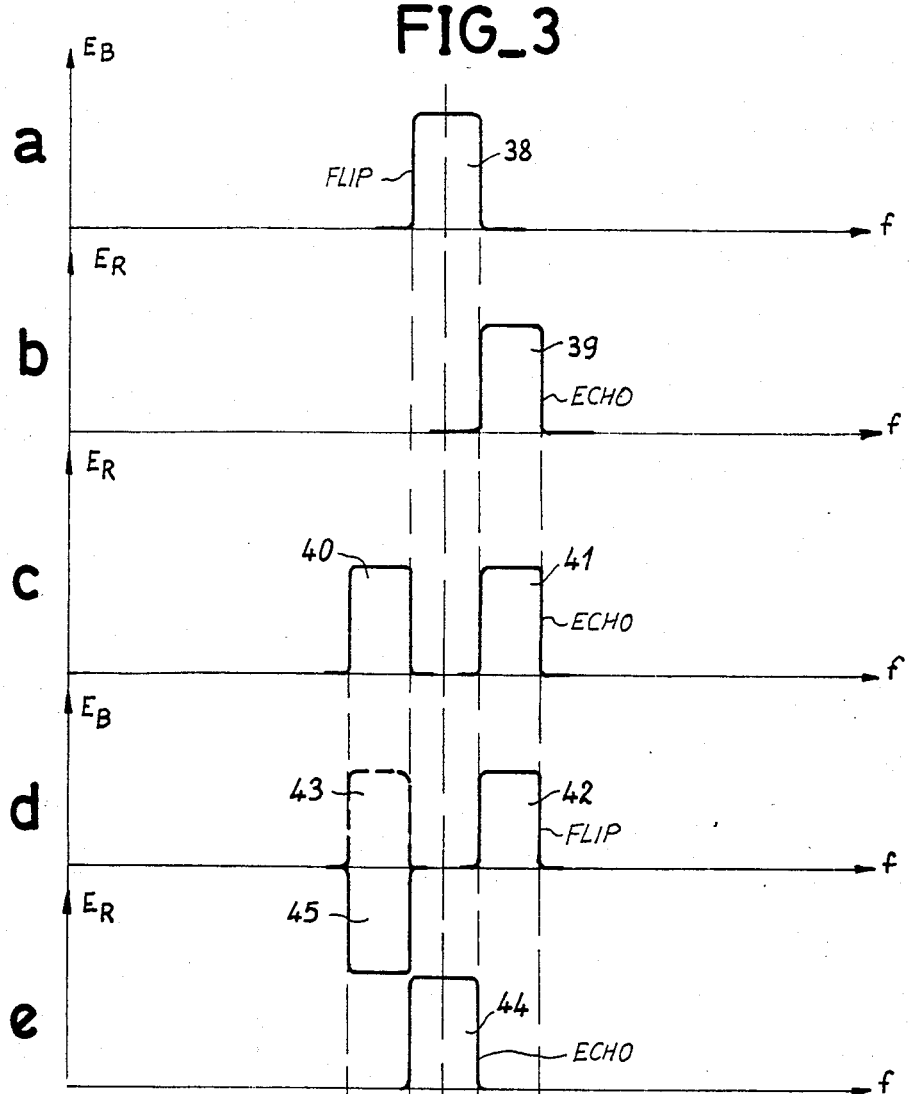
FIG_3
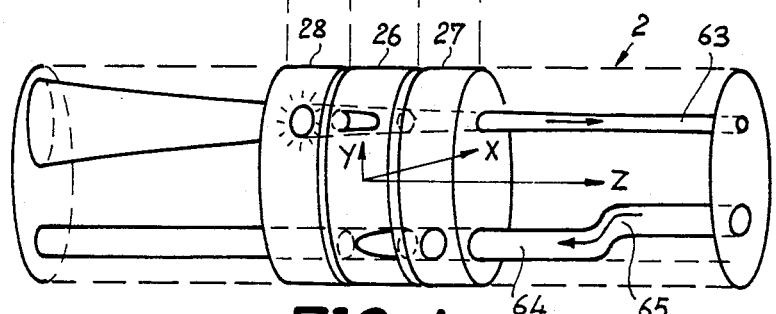
FIG_4

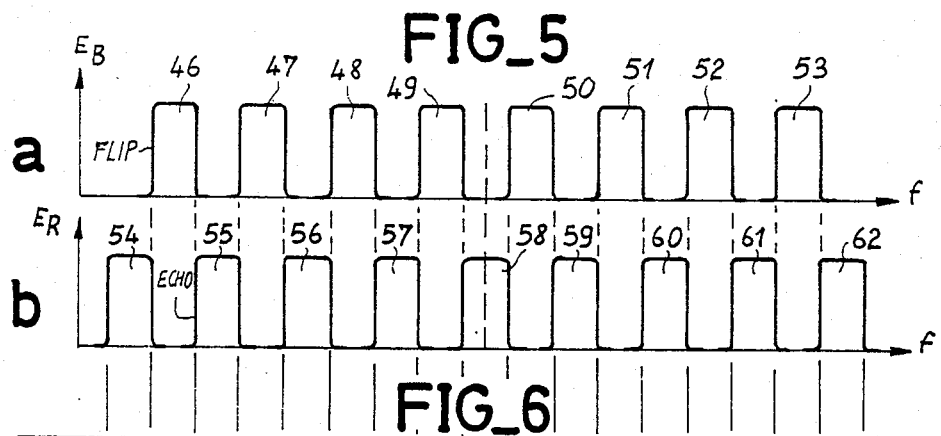
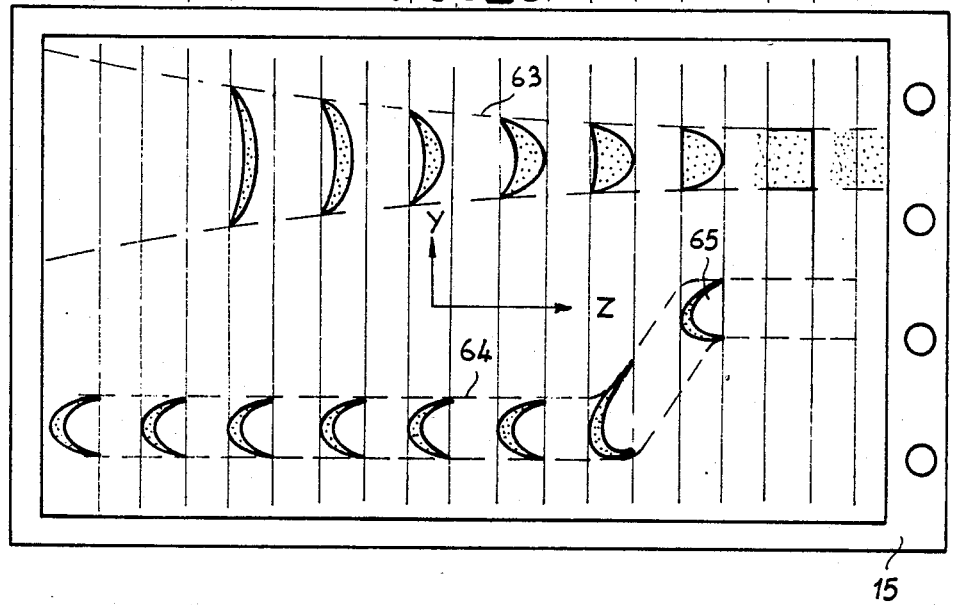
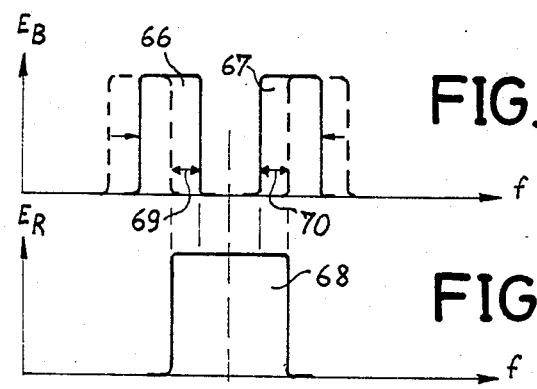

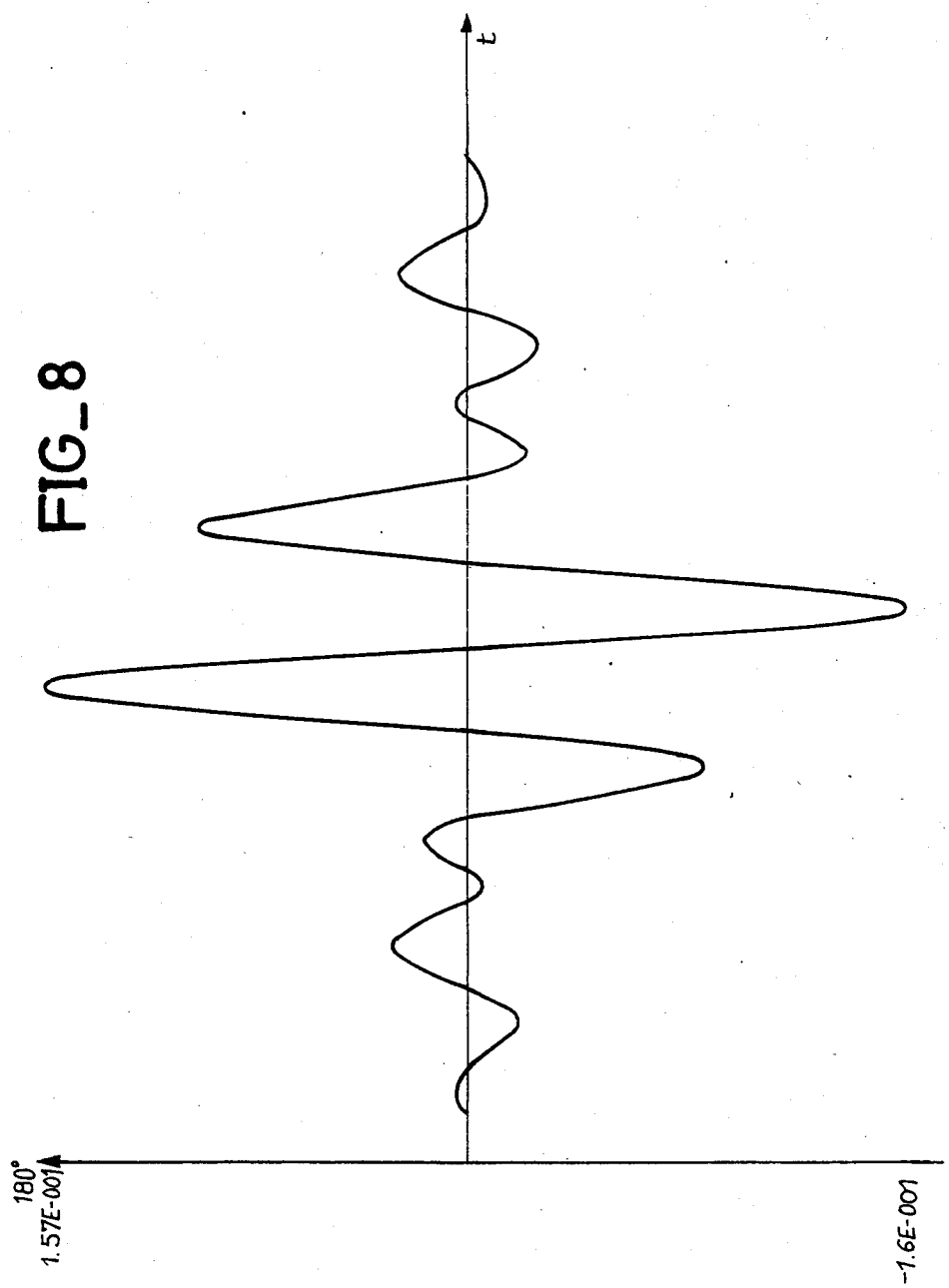
FIG_8

METHOD FOR MEASURING FLOWS IN A NUCLEAR MAGNETIC RESONANCE EXPERIMENT

BACKGROUND OF THE INVENTION

1. Field of the Invention

An object of the present invention is a method for measuring flows in a nuclear magnetic resonance (NMR) experiment. Experiments of this type have long been used for physical measurements. In recent years they have also been used in the medical field. As a matter of fact, NMR has lately proved to be one of the main techniques for investigating the inside of the human body. It does not cause any trauma and is not painful. While the earliest developments of this technique were related to knowledge of the architecture, anatomy and fixed parts of the body, there is now a change towards a demand for knowing the characteristics of moving parts of the body. For example, in the human body, there is a great need to know the distribution of blood flowing in the heart.

2. Description of the Prior Art

There are several known techniques for measuring flows in NMR experiments. In particular, the European patent application No. 84 307746.2, filed on 9th Nov. 1984, describes a method for reducing sensitivity to motion in images obtained by NMR. The flows, in this method, are depicted by means of two successive, complementary acquisitions. In a first acquisition, the effect of the motion of the moving parts is not compensated for in the measurements: as a result, the data obtained gives only a picture of whatever is fixed in the body. In a second acquisition, the effects of the speed of the moving parts in the NMR signal are compensated for in such a way that these moving parts effectively contribute to the signal. By comparing the data acquired at the end of the second acquisition with the data acquired at the end of the first acquisition, data pertaining only to the moving parts is deduced. The drawback of this method is that it calls for two acquisitions. Moreover, for reasons which shall be explained further below, each acquisition should be by synchronizing the acquisitions on a phase of an examined cyclic movement in the body which is studied. In doing so, it is implicitly assumed that the moving phenomenon studied is stationary to a certain degree. This assumption that the phenomenon is periodically stationary is all the more unwarranted when it concerns prolonged periods. This is wholly the case when data is obtained at the end of two acquisitions which are already lengthy in themselves.

Another method has been presented by G. Bielke, S. Meindl, W. V. Seelen and P. Pfannenstiel of the Deutsche Klinik Für Diagnostik, Wiesbaden, Federal Republic of Germany, at the SMRM's Fifth Congress on NMR medical imagery held at Montreal, Quebec, from 19th to 22nd Aug. 1987 (Volume 1 pp. 76 and 77). This technique is called the "Quantitative assessment of laminar volume flow by orthogonal excitation with multiple echoes". This method consists in exciting the magnetic moments of the nuclei of a body, in a given slice of this body. They are made to flip and, at each excitation sequence, the magnetic moments thus flipped, are subjected to a subsequent excitation, called a spin echo, which has the specific feature of having a large band. This means that the effect of this spin echo excitation is not restricted to the protons which remain in the slice (the fixed protons) but also concerns protons (those in motion) which have left the slice. To select the slice, a so-called selection encoding gradient is used. According to a known technique, a read gradient is used when detecting the signal. In the technique referred to, the read gradient has the specific feature of being oriented in the same direction as the selection gradient. The immediate result of this is that the moving parts then contribute to the NMR signal with, at the measuring instant, a frequency which is shifted with respect to the central resonance frequency. The shift represents the strength of the applied gradient (which is known) and the distance between the concerned protons in the slice in which they were at the excitation. In a way, the distance travelled by these protons is measured. For predetermined periods of experimenting, the speed of the protons considered is deduced from this distance. In practice, the image of the slice is projected in a plane perpendicular to itself: its projection resembles a line. The moving parts then appear in the image of the line as localized humps with regard to the alignment of this line. In a preferred way, the images are obtained with an imaging method known as the phase encoding method or also the 2DFT method. In this imaging technique, several measuring/excitation sequences are undertaken, and a second encoding gradient is applied between the excitation pulse and the spin echo pulse of each sequence. The value of this gradient changes from one sequence to another during the experiment. The image shown is an image obtained by projection in a plane containing the axis of this phase encoding gradient and the read axis (which, in the present case, is also the selection axis).

This latter technique has one essential drawback: the range of data presented is unfavorable to precisely that phenomenon which is to be shown. For the hump observed with respect to the alignment depends, as we have seen earlier, on the speed of the moving parts. For example, in medecin, this flexure may represent the blood in an artery or vein or in the heart. Now the speed diagram of a fluid is continuous. On the walls of the flow tube (i.e. the tube in which the flow occurs), the flow is almost nil whereas, at the center of the tube, it is at the maximum. The result of this is that the flexure on the line will look substantially like a portion of a parabola. The two wings of this parabola bear on the projected line: they represent those parts for which the flow is small. In an image of a slice of a real human body, it may be considered, for example, that the diameter of a flow tube of this type is about 1 cm, i.e. substantially 30 times smaller than the diameter of the body. Since the image is a projected image, at the place of the flexure the lines showing parts moving at low speeds can be seen intermingled with the lines showing fixed parts located so that they are vertical (because of the projection) to either side of the considered flow tube. Now the lines showing the fixed parts are substantially 30 times bigger (in fact 29 times=30−1) than the lines of the moving parts. In the end, these latter lines are not seen. The data on these moving parts appears like a noise with respect to the signal related to the fixed parts.

The invention removes the drawbacks referred to, by proposing a measurement of the flows of moving parts wherein a single acquisition is needed and wherein the image of the fixed parts is eliminated so as to increase the useful dynamic range of depiction of parts in motion. Essentially, in the invention, a predetermined slice of the body is excited by making the magnetic moments of the particles of the body placed in this slice flip, preferably by 90°, whether these particles are fixed particles or moving particles. During the sequence, by means of a subsequent excitation of the spin echo type, the scattering of the phase of the free precessional signal of the excited magnetic moments is caused to be reflected. This dispersal is due to non-homogeneity in the orienting field of the machine and, for this reason, this subsequent excitation is known as a reflecting excitation. In the invention, this reflecting excitation has the specific feature, unlike in the second prior art technique described, of having not an excessively large band but a normal one, and of being applied, in the presence of one and the same selection gradient, to a frequency which is shifted with respect to the central resonance frequency so that it causes a useful phase reflection only for particles which are now in a slice adjacent to the slice that was excited beforehand. The result of this is that, at the instant of reception, the revival of the NMR signal concerns only particles which have left the slice excited beforehand. The fixed particles, which have not left it, do not contribute to the NMR signal. The result of this is that the dynamic range of the received signal can be used for a better depiction of the diagram of flows. In the prior art method referred to, the reflecting pulse could not have large band but could be, in fact, a single frequency band applied without any selection gradient. This amounts to the same thing. Finally, in the invention, at the reading instant, a gradient field is also applied to the body, this gradient field being oriented in the same direction as the gradient used to make the selection. At each sequence of the experiment, the strength of a phase encoding gradient is also modified so as to have a series of measurements useful for the depiction of the image.

SUMMARY OF THE INVENTION

The invention therefore relates to a method for measuring flows in an NMR experiment, wherein:
  a body to be examined, comprising parts in motion, is subjected to an orienting magnetic field,
  at least one slice of this body is excited selectively so as to flip the orientation of the magnetic instants of the parts of this body located in this slice,
  the resonance signal resulting from this flipping excitation is picked up, and
  it is processed in order to extract a piece of information from it on flow relating to the moving parts,
  the excitation comprises, after the flipping excitation but before the pick-up, the application of at least one reflecting excitation, the effect of which is limited in space to at least one slice of the body, said slice being adjacent to the slice excited selectively by the flipping excitation. In an improvement, the excitation comprises
  the application of at least one reflecting excitation, the effect of which is simultaneously limited in space to at least two neighbouring slices, said neighbouring slices being adjacent on either side to at least one slice of the body which is excited selectively by flipping excitation.

In another improvement, the flipping excitation comprises the limited simultaneous excitation of least two neighbouring slices of the body, and the reflecting excitation is such that at least one region of space where its effect is limited is a region adjacent to the two neighbouring slices thus subjected to the flipping excitation.

In another improvement, the region of space where the flipping excitation exerts its effect partly encroaches on the regions of space where the reflecting excitation exerts its effect.

BRIEF DESCRIPTION OF THE DRAWINGS

The invention will be better understood from the following description and the accompanying figures. They are given purely by way of indication and in no way restrict the scope of the invention. Of these figures:

FIG. 1 shows a schematic view of a machine to implement the method according to the invention;

FIGS. 2(a–d) show timing diagrams of signals that come into play in the method according to the invention;

FIGS. 3(a to e) show specific spectral features, schematically depicted, of excitations applied to the body to be examined;

FIG. 4 shows a schematic view of a body with flow tubes;

FIGS. 5(a,b) show a multiple-slice alternative to the method according to the invention;

FIG. 6 shows an image of a flow applying the method according to the alternative method;

FIGS. 7a and 7b show a modification of the preceding spectra to improve the legibility of the image;

FIG. 8 shows a timing diagram depicting the temporal form of one of the envelopes of radio-frequency excitations which, in one example, correspond to the spectral diagrams of FIGS. 3 and 5.

DESCRIPTION OF PREFERRED EMBODIMENTS

FIG. 1 shows an NMR machine which can be used to implement the method according to the invention. This machine has cheifly means 1 to subject a body 2 to an intense, homogeneous, continuous, magnetic field $B_O$, known as an orienting field. Through gradient coils 3, the body 2, once introduced into the machine can be temporarily subjected to additional, so-called field gradient magnetic fields which can be used in a known way with imaging methods. Thus, during series of excitation sequences, the body is subjected to radio-frequency electromagnetic excitations applied by an antenna 4 comprising, for example, a set of four radiating conductors, 5 to 8, powered by an oscillating circuit 9 to which a generator 11 of radio-frequency excitations is coupled by means of a coupling 10. When the excitations stop, the antenna 4 can be used to measure the de-excitation signals. This de-excitation signal, also called an NMR signal, is conveyed by means of a duplexer 12 to receiving means 13. The receiving means are connected with processing means 14 which may themselves be connected with means 15 for displaying images of parts of the body as desired. All these elements are piloted by a sequencer 16. The machine further has other logistic means, such as a table-top 17, to bring the patient's body into the examining tunnel, said means being of no consequence with regard to the present invention.

FIGS. 2a and 2d show timing diagrams of signals applied to the body and received from it during one sequence of a series of sequences of NMR experiments according to the invention. In the invention, the excitation (2a) is essentially an excitation of the so-called spin echo type. For this purpose, the excitation comprises a first flipping excitation 18 which causes a 90° flip in the orientation of the magnetic moments of the particles located in the region of the body to be examined. It also comprises a second reflecting excitation 19, also commonly known as a spin echo excitation, the object of which is to cause a 180° variation in the orientation of the magnetic moments which are undergoing free precession under the effect of the flipping excitation 18 and the field $B_O$. While the non-homogeneous qualities of the orienting field $B_O$ have caused a scattering of the orientation (the phase) of the precession of the various magnetic moments of the particles excited in the region considered, the reflecting excitation causes a reflection of this scattering. In this way, the NMR signal S shown in FIG. 2d, which fades away very quickly after the flipping excitation 18, is revived at the end of an echo period $T_e$. The period $T_e$ is equal twice the period between the application of the flipping excitation 18 and the reflecting excitation 19.

In order to locate a considered region of the body, namely a slice, with precision, a pulse 20 of a selection gradient (2b) is applied simultaneously with the flipping excitation 18. To simplify the explanation, with reference to FIG. 1, the gradient applied in one example is a field gradient oriented along the axis Z colinear with the orienting field. It is known that, by acting in this way, it is possible to cause the rise of a resonance signal in a limited transversal slice of the body 2. The pulse 20 is followed conventionally on the same axis by a pulse 21 for phase recoding because of the phase shift implied by the selection gradient. When the reflecting pulse 19 is applied, a pulse 22 of a gradient, also oriented along the axis Z, is also applied. It will be shown further below how this pulse 22, in combination with a reflecting pulse 19 according to the invention makes it possible, in fact, to select a slice adjacent to the examined slice.

The signal is measured in the presence of a pulse 23 with a so-called read gradient which, in the present case, is also a gradient oriented along the axis Z, namely the axis used to select the slice. So as to compensate for the phase shifts caused at the instant of reading of the NMR signal by the read gradient, a known type of pulse 24, of a known type, known as a read precoding pulse, is applied between the two pulses, namely the flipping and reflecting radio-frequency pulses. The fact of choosing a read axis colinear with the selection axis implies that the received NMR signal actually corresponds to a projection, along a direction parallel to the plane of the slice, of the contributions to the resonance signal of the particles which originally belong to this slice. By means of a so-called phase encoding pulse 25, applied to an axis perpendicular to the earlier pulse (for example, here, the axis Y) the amplitude of which varies from one sequence to another of the series of experimentation sequences, a series of measurements can be collected. With these measurements, it is possible to reconstruct an image of the projection. The reconstruction of this image uses the so-called 2DFT imaging method.

FIGS. 3a to 3e, along with FIG. 4, show the specific features of the invention. FIG. 4 gives a schematic view of the body 2. Of this body 2, the FIG. 4 more specifically shows three slices respectively, 26 to 28, adjacent to one another and substantially perpendicular to the axis Z. It is known that the presence of a gradient during the application of a flipping excitation $E_B$ and a reflecting excitation $E_R$ has the effect of modifying the local resonance conditions. Essentially, the resonance frequency f develops in a slice along its abscissa measured on the axis Z: on the gradient application axis. Conventionally, referring to figure 3a, the spectrum 38 of the excitation 18 is such that it causes a 90° flip only of the magnetic moments of the particles in the slice 16. The magnetic moments of the particles outside the slice are not flipped. The depiction of the spectrum of this excitation in the form of a rectangular pulse is in fact only schematic. It takes into account a linear approximation that might occur between the flip angle and the coefficient of the spectral component which, in the concerned local conditions, causes the expected flip. In practice, this linear approximation is false. However, for the explanation, it is simpler to use a diagram of this type. Moreover, there is knowledge of how to draw the diagram of the exact spectrum to obtain a 90° flip of the magnetic moments of the particles located in a slice and a zero flip of the magnetic moments of the particles located outside the slice.

FIG. 3b gives a schematic view of the essential features of the invention. As a matter of fact, the reflecting excitation, applied in the presence of the same gradient as the flipping excitation, quite simply has a spectrum which is shifted in frequency so as to cause the scattering of the phase of the precession of magnetic moments to be reflected only for particles which, at the instant of this reflecting excitation, have reached a slice 27 adjacent to the slice 26 where the initial flipping excitation was provoked. In other words, the spectrum 39 of the reflecting excitation 19 is adjacent to the spectrum 38 of excitation 18 (if the selection gradient has the same strength each time). A scrutiny of FIG. 2d shows that the only NMR signal capable of being revived at the end of the echo time $T_e$ is the NMR signal relating to moving particles. The signal relating to the fixed particles is not revived: it remains nil. The result of this that the relative dynamic range of the NMR signal for the moving particles with respect to the NMR signal for the fixed particles is now infinite. In the second prior art method described, this relative dynamic range was unfavorable to the NMR signal for moving particles. In one alternative, the spectrum 39 pulse 19 is replaced by a reflecting pulse of spectrum 40, 41 (FIG. 3c). This means that the point of interest is, in fact, the moving particles that have left the slice 26 and have migrated, at the instant when the reflecting excitation pulse is applied, to the right (27) or left (28) of the slice 26. However, it is possible to proceed differently. Rather than using a flipping excitation that produces its effect in a single slice and a reflecting excitation that produces its effect on either side of the flipping slice, it is preferred to cause a flipping of the magnetic moments of the particles located in two neighbouring slices 27 and 28 (FIG. 3d, $E_B$ 42, 43), and to cause the phase scattering to be reflected only in a single slice 26 by means of a reflecting excitation for which the spectrum 44 (figure 3e) is limited to this slice alone, adjacent, on either side, to the two neighbouring slices 27 and 28. In a preferred way, it is even possible to recognize the direction in which the excited particles migrate by choosing, for the two neighbouring slices 27 and 28, spectra for which the spectral components 42 and 45 are preferably in reverse phase from one slice to the other. It is again possible to proceed differently inasmuch as what is sought essentially is to make an image of the moving parts in the body. In this case, a flipping excitation is preferably chosen, the spectrum of which is shown in FIG. 5a. With a flipping excitation of this type, at the instant when the selection gradient is applied, the resonance is excited in several neighbouring slices simultaneously. For example, here, because the flipping excitation comprises (schematically) flipping spectra limited to eight frequency ranges numbered 46 to 53, it is possible to simultaneously examine what happens in eight neighbouring slices. Thus, the spectrum (FIG. 5b) of the corresponding reflecting excitation is interlaced with that of the flipping excitation. In the example shown, it has nine frequency ranges numbered 54 to 62. FIG. 6 shows the image thus obtained straight below the FIGS. 5a and 5b. In fact, because of the selection gradient placed on the same axis as the read gradient, there is a very close correspondence between the frequency ranges of the excitations and the geographic slices of the body 2. FIG. 6 also shows the axes Y and Z describing the image: the former because it corresponds to the phase encoding gradient and the second because it corresponds to both the selection gradient and the read gradient. FIG. 6 shows a slice along this kind of a plane Y Z of the body 2 at the position where two flow tubes 63 and 64 respectively, pass through (FIG. 4). To simplify the figure, the flow tube 64 has a characteristic bend 65. Furthermore, in the flow tube 64, the flow has constant characteristics all along the tube. In the tube 63 the flow changes, from left to right in the picture, from a laminary state to a turbulent state.

The localizing of the pictures should be recalled at first. While the particles were excited when they were in one slice, for example perpendicular to the spectrum, at the end of a period $T_e/2$, they were subjected to a reflecting pulse. They were then substantially on a slice corresponding to the spectrum 55 (or 54 depending on their direction). Their NMR signal is measured at the end of a period $T_e$ while they were substantially shifted symmetrically with respect to the geographical range corresponding to the spectral range 55, i.e. roughly vertical to the slice 47. If the number of slices of the image is sufficient and if the slices are thin enough, this effect is of little consequence although, in the conduit 64, the particles vertical to the slice 47, during their flipping excitation, have their NMR signal measured while they are substantially vertical to the slice 46. When the flow is laminar, all the particles move at substantially the same speed. In the distribution of these particles in tube 64, their space between them is small along the axis Z. On the contrary, when the flow is turbulent, as in the tube 63 to the right, the particles are distributed over a greater length in space. The signal has there less contrast. This distribution goes beyond either side of the slices. The thickness of the slices plays a role depending on the expected speed range. For example, a nominal speed of 1 m per second, equivalent to 1 mm per millisecond, amounts to a choice, with an echo time $T_e$ of 40 ms, of a 20 mm thickness of the slice subjected to the reflecting pulse. When the reflecting excitation is applied, the fastest particles, moving at the nominal speed, will have travelled substantially 20 mm, while the slowest particles will have hardly moved with respect to the flipped slice. At the end of the echo time $T_e$, these particles are distributed in a thickness substantially equal to twice the thickness of the slice to which the reflecting pulse is applied if the flow is highly turbulent.

In the example given, with an echo time of 40 ms, it is possible to choose a repetition time $T_r$, between each sequence, of about 100 ms. This time is short. It favors the measurement of moving phenomena. Frequent synchronizing is easier and, for an average period of 750 ms of a normal cardiac cycle, it can be expected that it will be possible to make up to seven successive acquisitions so as to show seven states of flow at different stages in this cardiac cycle. One consequence of this short repetition time is that the revival of the magnetization of the magnetic moments is not very high during this short period as compared with an average spin lattice relaxation time $T_1$ about 500 ms. However, this low revival concerns only the magnetic moments of fixed parts. It does not concern the magnetic moments of the moving parts which are constantly renewed in the slice. The consequence of this is rather favorable because it provides the benefit of even better contrast in the depiction of the moving parts as compared with the fixed parts.

However, this approach is not advantageous in every respect. For, in the heart, what moves is firstly blood and secondly, heart muscle. This means that if the repetition time $T_r$ is excessively reduced, the contrast at $T_1$ is no longer perceptible and, unfortunately, blood and heart muscle already have relaxation times $T_1$ that are close to each other. Thus, in the image of the moving parts, much can be seen but it is no longer possible to discriminate between blood and heart muscle. The result of this is that, finally, if this discrimination is to be possible, the repetition time has to be increased, somewhat unnecessarily as regards the other aspects of the invention. This would mean that all the advantages of the method could not be available. In the invention, this problem of differentiating between blood and heart muscle is resolved by no longer making a complete separation between the fields of action of the flipping excitations and the reflecting excitations. On the contrary, they are made to mingle slightly. FIG. 7 shows a situation of this type where the flipping excitation has two spectral ranges, 66 and 67 respectively, which slightly interpenetrate a frequency range 68 set apart for the reflecting excitation. The result of this is that the protons or fixed particles, located in the geographical space corresponding to the fixed parts of these spectra (for which the frequency ranges 69 and 70 are shown in FIG. 7) contribute to the NMR signal and, in a way, reveal the structure of the examined body. With this approach, there is a loss in relative dynamic range, but a gain in the legibility of the image. And this is especially worthwhile if the image is made in the plane of the flipped or reflected slices. In this case, the read gradient is perpendicular to the selection gradient and to the phase encoding gradient. The image obtained is a conventional one. It is not a projected image. Furthermore, since it is known that when the heart muscle is compressed in one direction, the blood is pushed out in a direction orthogonal to this direction, it is possible to recognize, in the depicted movements, that part which belongs to the heart muscle and that part which belongs to the blood. The practitioner can then diagnose circulatory problems or muscular problems as the case may be. As referred to earlier, the image of the fixed parts reduces the relative dynamic range of the image of the moving parts with respect to that of the fixed parts. It is therefore important to make an appropriate choice of the width of the ranges 69 and 70. For this purpose, two different approaches may be used. Either the spectra of the flipping pulse are brought closer to each other (in the direction of the arrows FIG. 7a) or else the spectrum of the reflecting excitation is, on the contrary, widened. In the conventional image of flipped slices and reflected slices, there is an automatic distinction made between heart muscle and blood: the muscle remains in the flipped slice while the blood joins the reflecting slice if the selection gradient is parallel to this flow. It is now necessary to describe the way to determine the temporal envelopes of the radio-frequency excitations that correspond to the schematic spectral diagrams of FIGS. 3, 5 and 7. With respect to the diagrams 38 and 39, the state of the art in NMR imaging, especially as regards so-called multiple-slice techniques, already enables the creation of the corresponding excitations. Besides, the same is the case for the spectrum 44 reflecting excitation. Only the frequency shifts are needed. To determine the reflecting excitation, the spectrum of which is marked 40 and 41, it is possible to take an empirical approach or to use a method described in a European patent application No. 85 401 746 filed on 6th Sept. 1985. It is also possible, preferably, to use a method for the determining of an excitation pulse, described in a French patent application No. 86 10179 filed on 11th July 1986. The equivalent U.S. application is Ser. No. 07/309,798, filed Jan. 10, 1989. This latter method gives a new approach to the defining of radio-frequency excitation pulses. Without going into the details of this invention, it is known that it results in optimized excitations. These excitations are given directly herein in specific examples. The table No. 1 below tabulates the temporal envelope of a flipping excitation for which the spectrum is 40–41. The value tables 2 and 3 (the latter table is not standardized) represent flipping excitations, with spectra 43, 42 or 45, 42 respectively. FIG. 8 shows the curve of the excitation corresponding to this spectrum 45, 42. It is possible to diverge from the temporal envelopes thus defined by +/−5% without excessively lowering the quality of the images. These temporal envelopes are used for the amplitude modulation of an excitation signal oscillating at a frequency equal to the fundamental resonance frequency fo of the NMR machine used.

TABLE 1

| 70 | 80 | |
|---|---|---|
| −0.00000 | −0.38685 | −0.19279 |
| −0.00614 | −0.34810 | −0.14383 |
| −0.01222 | −0.27607 | −0.11701 |
| −0.03645 | −0.20405 | −0.09020 |
| −0.05264 | 0.03496 | −0.04216 |
| −0.06882 | 0.18542 | −0.02541 |
| −0.09236 | 0.33588 | −0.00367 |
| −0.09627 | 0.65143 | 0.01031 |
| −0.10418 | 0.78332 | 0.01706 |
| −0.10057 | 0.91520 | 0.02382 |
| −0.08950 | [1.00000 | 0.03126 |
| −0.07843 | 0.94984 | 0.03199 |
| −0.03407 | 0.89967 | 0.03272 |
| −0.01661 | 0.66033 | 0.00738 |
| 0.00085 | 0.50250 | −0.00768 |
| 0.00986 | 0.34466 | −0.02273 |
| 0.00028 | −0.00255 | −0.02842 |
| −0.00930 | −0.17947 | −0.01717 |
| −0.03292 | −0.35638 | −0.00592 |
| −0.03327 | −0.68231 | 0.03861 |
| −0.03362 | −0.80021 | 0.05687 |
| −0.02891 | −0.91810 | 0.07513 |
| −0.02356 | −0.98949 | 0.09382 |
| −0.01821 | −0.91977 | 0.09452 |
| −0.00290 | −0.85005 | 0.09523 |
| 0.00921 | −0.60094 | 0.08112 |
| 0.02132 | −0.45615 | 0.06639 |
| 0.06357 | −0.31136 | 0.05165 |
| 0.09114 | −0.04156 | 0.02466 |
| 0.11570 | 0.06129 | 0.01557 |
| 0.17903 | 0.16413 | 0.00647 |
| 0.18968 | 0.27679 | |
| 0.20072 | 0.29092 | |
| 0.19497 | 0.30504 | |
| 0.17736 | 0.26605 | |
| 0.15976 | 0.22847 | |
| 0.09798 | 0.19089 | |
| 0.05759 | 0.11058 | |
| 0.01720 | 0.08105 | |
| | 0.05153 | |

TABLE 1-continued

| | |
|---|---|
| −0.06518 | 0.02968 |
| −0.10035 | 0.03861 |
| −0.13552 | 0.04755 |
| −0.18307 | 0.09216 |
| −0.18639 | 0.11979 |
| −0.18971 | 0.14743 |
| −0.15664 | 0.19483 |
| −0.13076 | 0.20227 |
| −0.10438 | 0.20970 |
| −0.05316 | 0.18240 |
| −0.03653 | 0.15453 |
| −0.01990 | 0.12666 |
| −0.02334 | 0.05046 |
| −0.04752 | 0.00801 |
| −0.07171 | −0.03444 |
| −0.15750 | −0.11120 |
| −0.20871 | −0.13892 |
| −0.25991 | −0.16664 |
| −0.34867 | −0.19435 |
| −0.36776 | −0.19357 |

TABLE 2

| 60 | 60 | −0.29375 | −0.00693 |
|---|---|---|---|
| | −0.00427 | −0.02273 | |
| | −0.00950 | 0.25224 | |
| | −0.01172 | 0.50978 | |
| | −0.01057 | 0.72918 | |
| | −0.00619 | 0.89206 | |
| | 0.00066 | 0.98461 | |
| | 0.00874 | [1.00000 | |
| | 0.01637 | 0.93983 | |
| | 0.02170 | 0.81284 | |
| | 0.02294 | 0.63612 | |
| | 0.01863 | 0.43116 | |
| | 0.00793 | 0.21687 | |
| | −0.00918 | 0.01206 | |
| | −0.03181 | −0.16735 | |
| | −0.05812 | −0.30923 | |
| | −0.08550 | −0.40599 | |
| | −0.11080 | −0.45500 | |
| | −0.13103 | −0.45863 | |
| | −0.14234 | −0.42364 | |
| | −0.14272 | −0.36011 | |
| | −0.13104 | −0.27987 | |
| | −0.10746 | −0.19495 | |
| | −0.07362 | −0.11614 | |
| | −0.03249 | −0.05189 | |
| | 0.01183 | −0.00760 | |
| | 0.05468 | 0.01451 | |
| | 0.09135 | 0.01497 | |
| | 0.11775 | −0.00110 | |
| | 0.13102 | −0.02830 | |
| | 0.13004 | −0.05991 | |
| | 0.11568 | −0.08924 | |
| | 0.09089 | −0.11048 | |
| | 0.06037 | −0.11940 | |
| | 0.03010 | −0.11376 | |
| | 0.00569 | −0.09348 | |
| | −0.00489 | −0.06049 | |
| | 0.00248 | −0.01833 | |
| | 0.02991 | 0.02841 | |
| | 0.07694 | 0.07469 | |
| | 0.13998 | 0.11573 | |
| | 0.21241 | 0.14750 | |
| | 0.28505 | 0.16722 | |
| | 0.34710 | 0.17348 | |
| | 0.38735 | 0.16610 | |
| | 0.39560 | 0.14749 | |
| | 0.36414 | 0.11999 | |
| | 0.28898 | 0.08694 | |
| | 0.17062 | 0.05189 | |
| | 0.01431 | 0.01822 | |
| | −0.17015 | −0.01121 | |
| | −0.36892 | −0.03436 | |
| | −0.56610 | −0.05010 | |
| | −0.74128 | −0.05823 | |
| | −0.87420 | −0.05937 | |
| | −0.94883 | −0.05483 | |
| | −0.95334 | −0.04629 | |
| | −0.88313 | −0.03562 | |

TABLE 2-continued

| | |
|---|---|
| −0.74172 | −0.02458 |
| −0.53988 | −0.01466 |

TABLE 3

| | | |
|---|---|---|
| | 4.095291454239176-002 | 9.666554339175396-004 |
| 5.94634752738279E-004 | 3.16851059005398E-003 | |
| 1.32409663594034E-003 | −3.51659091858796E-002 | |
| 1.63433969820028E-003 | −7.10697735247354E-002 | |
| 1.47323250011895E-003 | −1.01657540113683E-001 | |
| 8.63404269931087E-004 | −1.24365210874600E-001 | |
| −9.25957366879662E-005 | −1.37268143824179E-001 | |
| −1.21855392979753E-003 | [−1.39413034457769E-001 | |
| −2.28263217298255E-003 | −1.31023951476345E-001 | |
| −3.02587534690110E-003 | −1.13320769558465E-001 | |
| −3.19819678752281E-003 | −8.86840783294985E-002 | |
| −2.59742925009203E-003 | −6.01089683778016E-002 | |
| −1.10609604897652E-003 | −3.02344632709598E-002 | |
| 1.27968333624662E-003 | −1.68092615336180E-003 | |
| 4.43417235736681E-003 | 2.33305022782000E-002 | |
| 8.10254994827049E-003 | 4.31105802445236E-002 | |
| 1.19196917907744E-002 | 5.66003160239444E-002 | |
| 1.54465379127961E-002 | 6.34334062173155E-002 | |
| 1.86276574029759E-002 | 6.39387276000529E-002 | |
| 1.98439605798298E-002 | 5.90613967624859E-002 | |
| 1.98974281031477E-002 | 5.02043205722031E-002 | |
| 1.82691372721844E-002 | 3.90180981480821E-002 | |
| 1.49819290607122E-002 | 2.71792054850973E-002 | |
| 1.02629729413396E-002 | 1.61915765383734E-002 | |
| 4.53004155195380E-003 | 7.23346608471742E-003 | |
| −1.64942840239632E-003 | 1.05957489166972E-002 | |
| −7.62299662301833E-003 | −2.02262762681981E-003 | |
| −1.27349059993882E-002 | −2.08735020111648E-003 | |
| −1.64153895354808E-002 | 1.53984659256359E-004 | |
| −1.82660899996895E-002 | 3.94499676885144E-003 | |
| −1.81290747758913E-002 | 8.35157795026269E-003 | |
| −1.61277373860051E-002 | 1.24405910999666E-002 | |
| −1.26709207264456E-002 | 1.54020512785752E-002 | |
| −8.41648894537149E-003 | 1.66452574410781E-002 | |
| −4.19624835005536E-003 | 1.58592043930064E-002 | |
| −7.93624891469165E-004 | 1.30324569238166E-002 | |
| 6.81675248157198E-004 | 8.43312975418413E-003 | |
| −3.45611556204049E-004 | 2.55496235092640E-003 | |
| −4.16929802116951E-003 | −3.96043782898772E-003 | |
| −1.07260811180811E-002 | −1.04131213999235E-002 | |
| −1.95151921959785E-002 | −1.61341200838650E-002 | |
| −2.96121964710193E-002 | −2.05640739544951E-002 | |
| −3.97393624030696E-002 | −2.33128358693536E-002 | |
| −4.83903682830736E-002 | −2.41850647195680E-002 | |
| −5.40013179731828E-002 | −2.31561454330696E-002 | |
| −5.51514264619836E-002 | −2.05619734900582E-002 | |
| −5.07660592034970E-002 | −1.67283714137108E-002 | |
| −4.02879082055109E-002 | −1.21199031529486E-002 | |
| −2.37866223549189E-002 | −7.23358078860139E-003 | |
| −1.99480292280548E-003 | −2.54054542633076E-003 | |
| 2.37204581872737E-002 | 1.56297220112141E-003 | |
| 5.14318461159768E-002 | 4.79068711266535E-003 | |
| 7.89218853032221E-002 | 6.98476330411237E-003 | |
| 1.03344601795946E-001 | 8.11741792767385E-003 | |
| 1.21875225748092E-001 | 8.27725350861571E-003 | |
| [1.32279607560649E-001 | 7.64361540849712E-003 | |
| 1.32907416451106E-001 | 6.45342406707568E-003 | |
| 1.23119978026386E-001 | 4.96541137875159E-003 | |
| 1.03405157808774E-001 | 3.42646387927271E-003 | |
| 7.52658638550023E-002 | 2.04394730309683E-003 | |

What is claimed is:

1. A method for detecting flows in an NMR procedure, wherein:
   a body to be examined, comprising parts in motion, is subjected to an orienting magnetic field,
   two parallel slices of this body are simultaneously excited in phase opposition selectively so as to flip the orientation of magnetic moments of the parts of said body located in said slices,
   a resonance signal resulting from this flipping excitation is received, and
   said resonance signal is processed in order to extract a motion artifact relating to the parts in motion,
   the method comprising, after the flipping excitation but before the reception, subjecting the body to at least one spin echo excitation, the effect of which is limited in space to at least one slice of the body, said at least one slice being adjacent to both the two parallel slices, so as to discriminate the direction of the movement of the moving parts in the received signal.

2. A method according to claim 1 wherein the processing operation comprises the imaging of flow data.

3. A method according to any one of claims 2 or 11 wherein the region of space where the flipping excitation exerts its effect partly encroaches on the regions of space where the reflecting excitation exerts its effect.

* * * * *